(12) United States Patent
Honda

(10) Patent No.: US 9,871,000 B2
(45) Date of Patent: Jan. 16, 2018

(54) SEMICONDUCTOR DEVICE AND MANUFACTURING METHOD, AND ELECTRONIC APPARATUS

(71) Applicant: SONY CORPORATION, Tokyo (JP)

(72) Inventor: Takayoshi Honda, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 15/022,087

(22) PCT Filed: Sep. 16, 2014

(86) PCT No.: PCT/JP2014/074364
§ 371 (c)(1),
(2) Date: Mar. 15, 2016

(87) PCT Pub. No.: WO2015/045934
PCT Pub. Date: Apr. 2, 2015

(65) Prior Publication Data
US 2016/0225722 A1    Aug. 4, 2016

(30) Foreign Application Priority Data

Sep. 30, 2013  (JP) .................................. 2013-204319

(51) Int. Cl.
*H01L 23/544* (2006.01)
*H01L 21/66* (2006.01)
*H01L 27/146* (2006.01)

(52) U.S. Cl.
CPC ............ *H01L 23/544* (2013.01); *H01L 22/12* (2013.01); *H01L 27/1464* (2013.01);
(Continued)

(58) Field of Classification Search
CPC ............ H01L 23/544; H01L 27/14687; H01L 2924/0002; H01L 2223/54426;
(Continued)

(56) References Cited

U.S. PATENT DOCUMENTS

2006/0197007 A1* 9/2006 Iwabuchi .......... H01L 27/14601
250/208.1
2008/0297634 A1* 12/2008 Uya .................. H01L 27/14623
348/294

FOREIGN PATENT DOCUMENTS

JP   2007-273727 A   10/2007
JP   2013-183161 A    9/2013

OTHER PUBLICATIONS

Office Action for JP Patent Application No. 2013-204319, dated Sep. 29, 2016, 3 pages of Office Action.

\* cited by examiner

*Primary Examiner* — Jasmine Clark
(74) *Attorney, Agent, or Firm* — Chip Law Group

(57) ABSTRACT

The present disclosure relates to a semiconductor device and a manufacturing method, and an electronic apparatus that enable manufacturing of a stacked structure with high precision. A solid-state image sensor includes a semiconductor substrate where a photodiode is formed, and an epitaxial layer where a transfer transistor to be stacked on the photodiode of the semiconductor substrate is formed, the epitaxial layer being formed by growing a crystalline layer with aligned crystal axes on the semiconductor substrate. A reentrant portion formed at an end portion of a registration measurement mark used for registration measurement to perform relative adjustment before and after a step of forming the epitaxial layer is formed to be distanced from a detection region for detecting the registration measurement mark by a predetermined distance. The present technology (Continued)

can be applied to, for example, various semiconductor devices having a stacked structure.

5 Claims, 11 Drawing Sheets

(52) U.S. Cl.
CPC .. *H01L 27/14605* (2013.01); *H01L 27/14612* (2013.01); *H01L 27/14632* (2013.01); *H01L 27/14638* (2013.01); *H01L 27/14643* (2013.01); *H01L 27/14687* (2013.01); *H01L 27/14689* (2013.01); *H01L 2223/5442* (2013.01); *H01L 2223/54426* (2013.01); *H01L 2223/54453* (2013.01); *H01L 2924/0002* (2013.01)

(58) Field of Classification Search
CPC ........... H01L 27/1464; H01L 27/14605; H01L 27/14632; H01L 27/14689; H01L 27/14612; H01L 2223/54453; H01L 27/14638; H01L 2924/00; H01L 2223/5442; H01L 22/12
See application file for complete search history.

SEMICONDUCTOR DEVICE AND MANUFACTURING METHOD, AND ELECTRONIC APPARATUS

TECHNICAL FIELD

The present disclosure relates to semiconductor devices and manufacturing methods, and electronic apparatuses, and particularly relates to a semiconductor device and a manufacturing method, and an electronic apparatus that enable manufacturing of a stacked structure with high precision.

BACKGROUND ART

In recent years, scaling-down based on Moore's law is facing limits and manufacturing cost of semiconductor devices has increased. Hence, it is considered to be very effective to stack elements within silicon serving as a semiconductor device's substrate, and utilize them to increase the number of elements and functions per unit volume, and the like.

For example. Patent Literature 1 discloses an image sensor with enhanced function in the stacking direction by stacking silicon by epitaxial growth where a crystalline layer with aligned crystal axes is grown on a substrate, after forming a structure on a silicon surface. Patent Literature 1 also proposes forming a mark by using a structure made of a material other than silicon. When a material other than silicon is used, however, lattice mismatch between the material and silicon causes a defect during epitaxial growth; hence, a level difference formed by etching silicon is desirably used as a mark.

Patent Literature 2 discloses a solid-state image sensor that includes a plurality of semiconductor layers formed by stacking silicon by epitaxial growth and forming a P-type well region once again after forming a P-type well region on a silicon surface by ion implantation.

Under low-temperature epitaxial conditions effective for suppressing auto-doping and reducing diffusion of a layer formed by ion implantation, a mark distortion tends to increase. Hence, Patent Literature 2 proposes stacking two layers of silicon under two types of conditions, namely an epitaxial condition causing the mark distortion while providing optimal characteristics, and an epitaxial condition sacrificing characteristics while exhibiting little influence of mark distortion. However, such a technology of performing epitaxial growth in two layers is a compromise of mark distortion, and characteristics and quality. It is originally desirable to allow precise detection of marks under epitaxial conditions that are advantageous in characteristics and quality.

In addition, Patent Literature 3 discloses a solid-state image sensor in which silicon includes a stacked pixel structure. Furthermore, with regard to bipolar devices, power devices, and the like, stacked semiconductor devices formed by epitaxial growth have been manufactured.

Further, Patent Literature 4 discloses a technology of, after a step of performing epitaxial growth, soaking a distorted shape (cross section) in a potassium hydroxide (KOH) solution and etching a crystal plane of silicon to enhance the mark's contrast. However, when the mark after the epitaxial growth is additionally processed, the processing itself causes variation of mark shapes; hence, it is desirable to avoid increasing the number of processing steps for the mark, as much as possible.

CITATION LIST

Patent Literature

Patent Literature 1: JP 2008-300614A
Patent Literature 2: JP 2002-343956A
Patent Literature 3: JP 2012-238648A
Patent Literature 4: JP 2008-130919A

SUMMARY

Technical Problem

The above-described manufacturing methods for manufacturing stacked semiconductor devices include a step of performing epitaxial growth, and it is important to surely perform registration between before the step of performing epitaxial growth and after the step of performing epitaxial growth. Performing this registration requires detecting an alignment mark and a registration measurement mark, which have been formed before the step of performing epitaxial growth, after the step of performing epitaxial growth.

However, the marks are distorted is the step of performing epitaxial growth, thus being difficult to detect with high precision. Therefore, a generally demanded registration precision of several tens of nanometers or less is very difficult to achieve in the image sensor in Patent Literature 1 or Patent Literature 3, a metal oxide semiconductor (MOS) device, and the like.

In addition, although mark detection is usually performed on a mark's planar shape by using an optical microscope or an image sensor, none of Patent Literatures 1 to 4 discloses direct improvement of the planar shape. In particular, scribe lines where marks are arranged have been reduced in size to 100 μm or less, in order to enhance the yield in a wafer, and marks arranged therein have thus been reduced in size. Since smaller marks exhibit greater influence of mark distortion, a technology of improving a mark's planar shape itself is required.

The present disclosure, which has been made in view of such circumstances, enables a stacked structure to be manufactured with high precision.

Solution to Problem

A semiconductor device of an aspect of the present disclosure includes: a semiconductor layer where a predetermined first element is formed; and a growth layer where a second element to be stacked on the first element of the semiconductor layer is formed, the growth layer being formed by growing a crystalline layer with aligned crystal axes on the semiconductor layer. A reentrant portion formed at an end portion of a measurement mark used for measurement to perform relative adjustment before and after a step of forming the growth layer is formed to be distanced from a detection region for detecting the measurement mark by a predetermined distance.

A manufacturing method of an aspect of the present disclosure includes: forming a predetermined first element in a semiconductor layer; forming a growth layer by growing a crystalline layer with aligned crystal axes on the semiconductor layer; and forming a second element to be stacked on the first element of the semiconductor layer on the growth layer. A reentrant portion, formed at an end portion of a measurement mark used for measurement to perform relative adjustment before and after a step of forming the growth layer is formed to be distanced from a detection region for detecting the measurement mark by a predetermined distance.

An electronic apparatus of an aspect of the present disclosure includes a semiconductor device. The semiconductor device includes: a semiconductor layer where a predetermined first element is formed; and a growth layer where a second element to be stacked on the first element of the semiconductor layer is formed, the growth layer being formed by growing a crystalline layer with aligned crystal axes on the semiconductor layer. A reentrant portion formed at an end portion of a measurement mark used for measurement to perform relative adjustment before and after a step of forming the growth layer is formed to fee distanced from a detection region for detecting the measurement mark by a predetermined distance.

In an aspect of the present disclosure, a reentrant portion formed at an end portion of a measurement mark used for measurement to perform relative adjustment before and after a step of forming the growth layer is formed to be distanced from a detection region for detecting the measurement mark by a predetermined distance.

Effects

According to an aspect of the present disclosure, a stacked structure can be manufactured with high precision.

DESCRIPTION OF EMBODIMENT(S)

Hereinafter, specific embodiments to which the present technology is applied will be described in detail with reference to the drawings.

Figure 1:
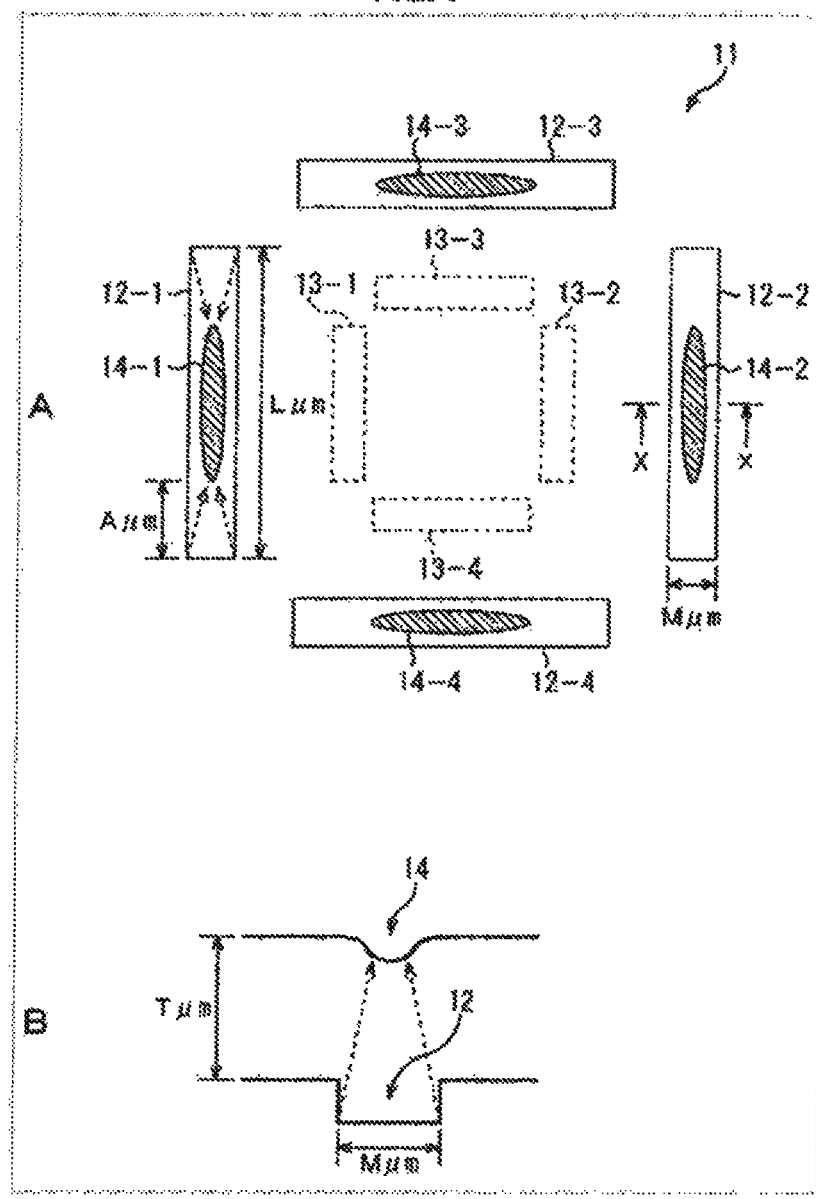
FIG. 1 illustrates a conventional registration measurement mark.

First, a conventional registration measurement mark is described referring to FIG. 1.

In FIG. 1, "A" is a plan view of a registration measurement mark 11, and "B" is a cross-sectional view of the registration measurement mark 11 taken along the line X-X in "A".

As illustrated in FIG. 1, the registration measurement mark 11 is formed by carving on to a surface of a silicon substrate.

The registration measurement mark 11 is a combination of main-scale marks 12 that are formed on the surface of the silicon substrate before a step of performing epitaxial growth and sub-scale marks 13 that are formed on the surface of the silicon substrate after the step of performing epitaxial growth, and is used for registration measurement. Cross-sectional shapes of the main-scale marks 12 are deformed as silicon is added to the silicon substrate in the step of performing epitaxial growth.

That is, as illustrated in "B" of FIG. 1, the main-scale mark 12 is formed in, for example, a shape having a width M, substantially perpendicular side surfaces and a bottom surface, and reentrant portions with substantially right angles, before the step of performing epitaxial growth. Then, silicon with a thickness T is added by epitaxial growth; thus, the cross-sectional shape is smoothly deformed and a main-scale mark 14 after the epitaxial growth is formed.

In other words, silicon grows fast in the reentrant portions formed by the side surfaces and the bottom surface of the main-scale mark 12 before the step of performing epitaxial growth; accordingly, silicon grows as indicated by the broken-line arrows in "B" of FIG. 1 and the cross-sectional shape is deformed to a smooth shape such that the reentrant portions disappear. Furthermore, in the following description, the main-scale mark 12 before the step of performing epitaxial growth is called pre-step main-scale mark 12, and the main-scale mark 12 after the epitaxial growth is called post-step main-scale mark 14, as appropriate.

In addition, as illustrated in "A" of FIG. 1, four pre-step main-scale marks 12-1 to 12-4 with bar shapes (long and narrow rectangles in a plan view) are arranged as the registration measurement mark 11. Then, epitaxial growth is performed; thus, the pre-step main-scale marks 12-1 to 12-4 are deformed to post-step main-scale marks 14-1 to 14-4, respectively. At this time, for example, silicon grows fast in reentrant portions formed by side surfaces in the long-side direction and side surfaces in the short-side direction of the pre-step main-scale mark 12-1; accordingly, silicon grows as indicated by the broken-line arrows in "A" of FIG. 1 and the reentrant portions are reduced to disappear.

After that, four sub-scale marks 13-1 to 13-4 are formed on the surface of the silicon substrate after the epitaxial growth to correspond to the post-step main-scale marks 14-1 to 14-4, respectively. Furthermore, when there is no need to distinguish the pre-step main-scale marks 12-1 to 12-4, they are called pre-step main-scale marks 12 as appropriate in the following description. The same applies to the sub-scale marks 13-1 to 13-4 and the post-step main-scale marks 14-1 to 14-4.

As described above, in the conventional case, the pre-step main-scale mark 12 is deformed to the post-step main-scale mark 14 having a distorted shape in which a straight portion has been curved, in association with the epitaxial growth. Hence, measurement precision is lowered in the registration measurement of measuring an interval between the sub-scale mark 13 and the post-step main-scale mark 14.

Here, a loss amount A of a pattern in the length direction of the pre-step main-scale mark 12 is calculated on the basis of the width M of the pre-step main-scale mark 12 and the thickness T of a silicon layer formed by the epitaxial growth. For example, when the thickness T is equal to or less than the mark width M (T≤M), the loss amount A falls in a range of approximately three times the thickness T (A=3×T), for example, one to four times the thickness T. This is because the reentrant portion is influenced by growth rates from three surfaces, i.e., two silicon wall surfaces and the bottom surface. When the thickness T is greater than the mark width M (T>M), the loss amount A falls in a range of approximately six times the thickness T (A=6×T), for example, three to six times the thickness T. This is because the reentrant portions re closer to each other than when the thickness T is equal to or less than the mark width M, and are influenced by growth rates of both of the reentrant portions.

Specifically, when the thickness T due to the epitaxial growth is 3 µm and the width M of the pre-step main scale mark 12 is 2 µm, the loss amount A of the pre-step main-scale mark 12 in the length direction is 18 µm. In other words, in this case, when a length L of the pre-step main-scale mark 12 is assumed to be 20 µm, the pre-step main-scale mark 12 will have almost been lost after the epitaxial growth, which means that measurement will be unable to be performed.

In view of this, the following description proposes improving a planar shape itself of the registration measurement mark 11, to allow registration measurement with higher precision.

Figure 2:
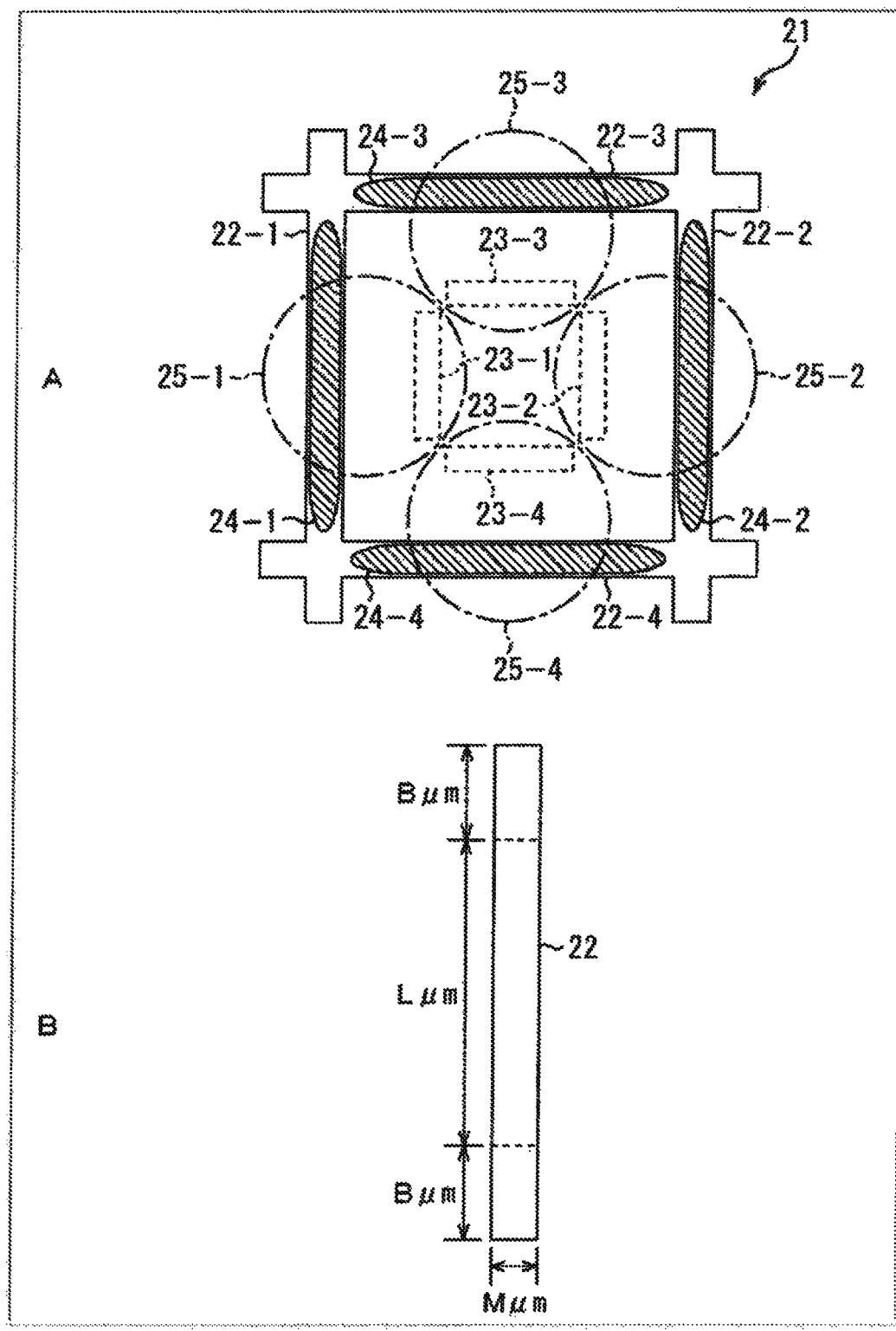
FIG. 2 illustrates an example configuration of a first embodiment of a registration measurement mark to which the present technology is applied.

FIG. 2 illustrates an example configuration of a first embodiment of a registration measurement mark to which the present technology is applied.

In FIG. 2, "A" is a plan view of a registration measurement mark 21, and "B" illustrates a pre-step main-scale mark 22.

The registration measurement mark 21 is formed by carving on to a surface of a silicon substrate, and is used for measurement to adjust relative positions (registration) before and after a step of performing epitaxial growth. In the example configuration of FIG. 2, the registration measurement mark 21 adopts a configuration in which four pre-step main-scale marks 22-1 to 22-4 with bar shapes are arranged to intersect each other substantially orthogonally at portions in vicinities of both ends. In other words, the pre-step main scale marks 22-1 to 22-4 are arranged such that pairs of them facing each other (the pre-step main-scale marks 22-1 and 22-2, and the pre-step main-scale marks 22-3 and 22-4) are substantially orthogonal to each other.

Here, an interval between the pre-step main-scale marks 22-1 and 22-2 is the same as an interval between the pre-step main-scale marks 12-1 and 12-2 of FIG. 1, and an interval between the pre-step main-scale marks 22-3 and 22-4 is the same as an interval between the pre-step main-scale marks 12-3 and 12-4 of FIG. 1. In addition, in the registration measurement mark 21, sub-scale marks 23-1 to 23-4 are formed in a manner similar to that of the sub-scale marks 13-1 to 13-4 of the registration measurement mark 11 in FIG. 1.

Then, the pre-step main-scale marks 22-1 to 22-4 are deformed to post-step main-scale marks 24-1 to 24-4 in association with the epitaxial growth, and intervals between the sub-scale marks 23-1 to 23-4 and the post-step main-scale marks 24-1 to 24-4 are measured in registration measurement. In FIG. 2, mark detection regions 25-1 to 25-4 that are set in performing the measurement are indicated by dashed-dotted circles. For example, in the mark detection region 25-1, the interval between the sub-scale mark 23-1 and the post-step main-scale mark 24-1 is measured.

Here, the pre-step main-scale mark 22 of the registration measurement mark 21 is formed such that reentrant portions formed at both ends thereof are distanced from the mark detection region 25 by a predetermined distance.

For example, as illustrated in "B" of FIG. 2, a length of the pre-step main-scale mark 22 is set to be longer than the length L of the conventional pre-step main-scale mark 12 by an extension amount B. Thus, the reentrant portions formed at both ends of the pre-step main-scale mark 22 are distanced from the mark detection region 25 by a predetermined interval corresponding to the extension amount B. In other words, the pre-step main-scale marks 22-1 to 22-4 are made longer while pairs of them facing each other have the same intervals as those in the conventional case; consequently, the pre-step main-scale marks 22-1 to 22-4 intersect each other at portions in the vicinities of both ends.

As described above, in the registration measurement mark 21, both ends of the pre-step main-scale mark 22 are extended by the extension amount B and thus the reentrant portions formed at the both ends are distanced from the mark detection region. This can prevent registration measurement from being influenced by the deformation of being lost from end portions, which is caused by significant deformation due to the reentrant portions as described referring to FIG. 1.

In other words, the pre-step main-scale mark 22 has a shape in which the reentrant portions, where the pre-step main-scale mark 22 is significantly lost owing to the epitaxial growth, are distanced from the mark detection region 25 by a predetermined interval. This shape can prevent a straight portion of the pre-step main-scale mark 22 from being deformed to be curved. This allows the post-step main-scale mark 24 to keep a straight portion in the mark detection region 25, and thus enhances detection precision, as compared with in measuring the conventional curved shape, and allows measurement with higher precision.

It is known that epitaxial conditions that are advantageous in mass productivity in terms of purity, reaction temperature, growth speed, cost, and the like satisfy the following: a silicon source gas contains chlorine (Cl), such as dichlorosilane (DCS; $SiH_2Cl_2$) and trichlorosilane (TCS; $SiHCl_3$); and growth speed is high (0.5 to several micrometers per minute). Since chlorine has an effect of etching silicon, silicon is deposited while edges of the pre-step main-scale mark 22 (particularly the reentrant portions where longitudinal and lateral edges are close to each other) are reduced. In addition, the reentrant portion of the pre-step main-scale mark 22 exhibits a substantial silicon growth speed higher than that of a flat surface, because silicon growth at three surfaces, i.e., the silicon bottom surface, a silicon wall surface in the length direction, and a silicon wall surface in the width direction, are close to each other. Furthermore, because of the high growth speed, a speed difference tends to be exhibited depending on silicon crystal plane orientation, and silicon is deposited while the reentrant portions of the pre-step main-scale mark 22 are lost.

Accordingly, by using the pre-step main-scale mark 22 having a shape in which both ends of the conventional pre-step main-scale mark 12 (FIG. 1) are extended by the extension amount B to distance the reentrant portions from the mark detection region 25, the influence of loss of the reentrant portions due to the epitaxial growth can be prevented. This allows precise detection, thus allowing registration with higher precision.

Furthermore, the extension amount B can be set in accordance with deformation that is predicted when epitaxial growth is performed under the above-described epitaxial conditions. In other words, the mark width M of the pre-step main-scale mark 12 and the thickness T of the epitaxial growth are used to set the extension amount B to an optimal value. For example, when the thickness T is equal to or less than the mark width M (T≤M), the extension amount B is preferably set to approximately three times the thickness T (B=3×T), and when the thickness T is greater than the mark width M (T>M), the extension amount B is preferably set to approximately six times the thickness T (B=6×T).

In addition, when the mark width M of the pre-step main-scale mark 12 of FIG. 1 is equal to or less than the thickness T, the extension amount B can be reduced by setting the mark width M to a larger width, for example, setting the mark width M to a width equal to or greater than the thickness T (T≤M).

Furthermore, in the registration measurement mark 21, silicon walls are formed in salient shapes at places where the pre-step main-scale marks 22-1 to 22-4 intersect each other and the places are not surrounded by the silicon walls; therefore, pattern loss does not occur.

As described above, in the registration measurement mark 21, by using the pre-step main-scale mark 22 having a shape that is set by predicting deformation in epitaxial growth in advance, the shape of the post-step main-scale mark 24 after the epitaxial growth can be improved. Thus, the precision of registration before and after the step of performing epitaxial growth can be enhanced.

Figure 3:
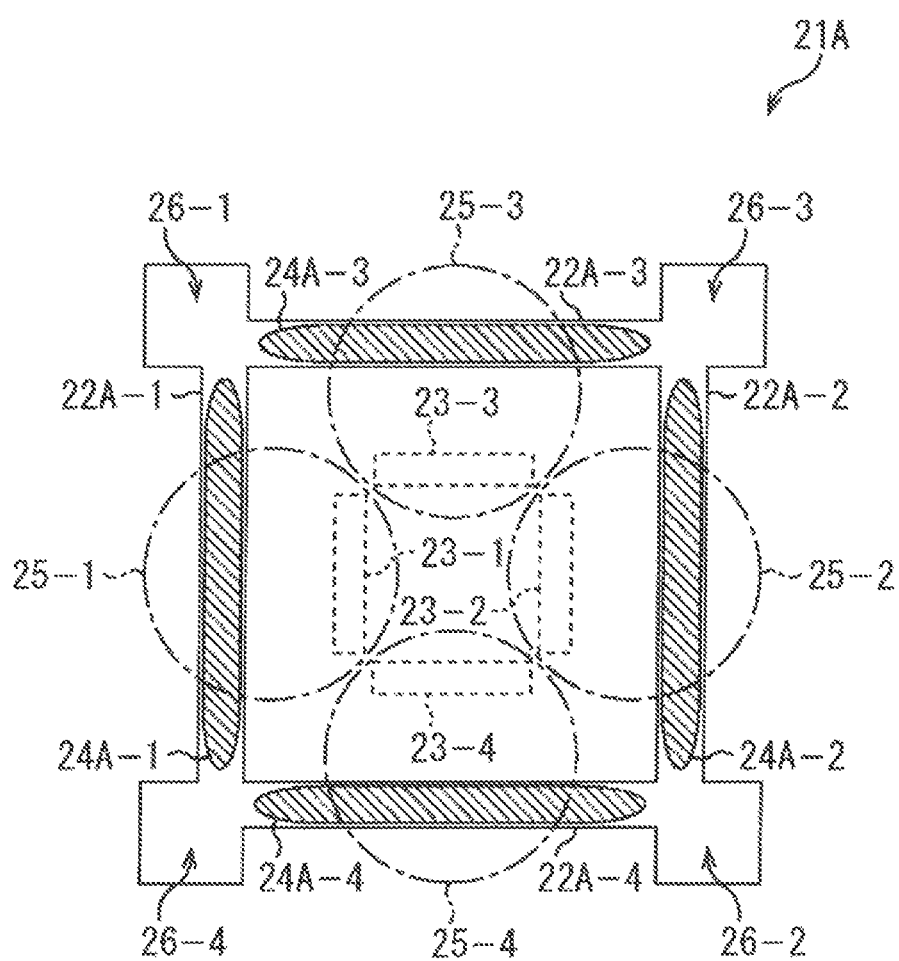
FIG. 3 illustrates an example configuration of a second embodiment of a registration measurement mark.

FIG. 3 illustrates an example configuration of a second embodiment of a registration measurement mark.

As illustrated in FIG. 3, in a registration measurement mark 21A, four pre-step main-scale marks 22A-1 to 22A-4 are arranged to intersect each other at both end portions, as in the registration measurement mark 21 of FIG. 2. Furthermore, in the registration measurement mark 21A, four corner portions 26-1 to 26-4 are formed such that salient portions on the outside at the intersections are expanded. Furthermore, in the registration measurement mark 21A, the sub-scale marks 23-1 to 23-4 are formed as in the registration measurement mark 21 of FIG. 2, and the mark detection regions 25-1 to 25-4 are also set at similar regions.

In other words, since the corner portions 26-1 to 26-4 are provided in the registration measurement mark 21A, reentrant portions are further distanced from the mark detection regions 25 than in the registration measurement mark 21 of FIG. 2.

As described above, in the registration measurement mark 21A, the corner portions 26-1 to 26-4 are provided such that the intersections of the pre-step main-scale marks 22A-1 to 22A-4 are expanded; thus, the reentrant portions where silicon grows fast can be distanced from the mark detection regions 25. Furthermore, the number of reentrant portions serving as starting points of the loss of the registration measurement mark 21A can be reduced, as compared with the registration measurement mark 21 of FIG. 2. Thus, a function as a buffer pattern against the loss of the registration measurement mark 21A can be implemented, and the registration measurement mark 21A can be prevented from being lost even if, for example, the thickness of a silicon layer formed by epitaxial growth is increased. Accordingly, registration measurement can be performed with higher precision.

Figure 4:
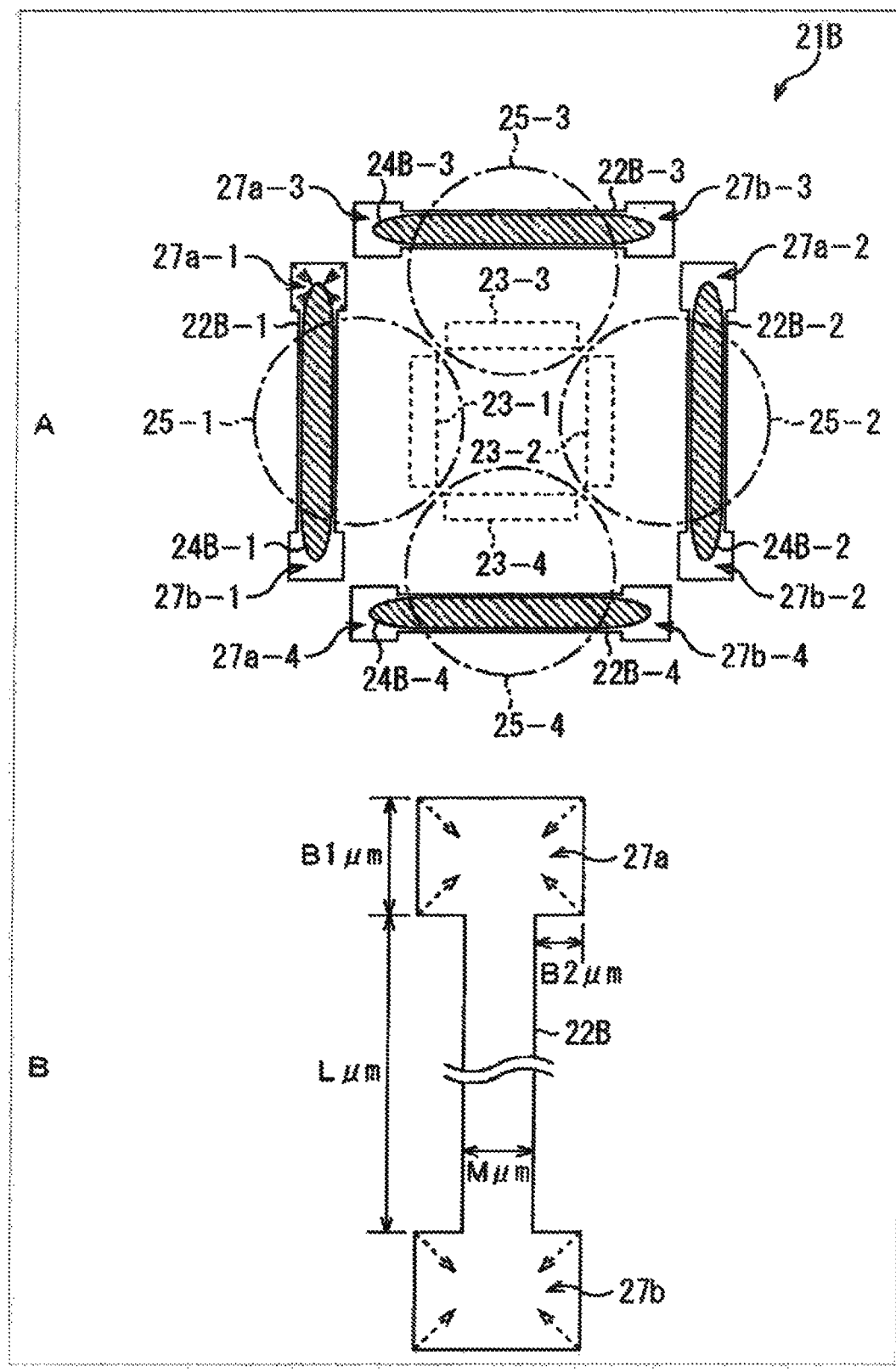
FIG. 4 illustrates an example configuration of a third embodiment of a registration measurement mark.

FIG. 4 illustrates an example configuration of a third embodiment of a registration measurement mark.

In FIG. 4, "A" is a plan view of a registration measurement mark 21B, and "B" is an enlarged view of the vicinities of both ends of a pre-step main-scale mark 22B.

As illustrated in "A" of FIG. 4, the registration measurement mark 21B has a configuration in which four pre-step main-scale marks 22B-1 to 22B-4 are arranged such that pairs of them facing each other are substantially orthogonal to each other. In addition, in the registration measurement mark 21B, the sub-scale marks 23-1 to 23-4 are formed as in the registration measurement mark 21 of FIG. 2, and the mark detection regions 25-1 to 25-4 are also set at similar regions.

In the registration measurement mark 21B, as illustrated in "B" of FIG. 4, enlarged portions 27a and 27b obtained by enlarging end portions of the pre-step main-scale mark 22B in the length direction and the width direction are formed at both ends of the pre-step main-scale mark 22B.

For example, an enlargement amount B1 of the enlarged portion 27a in the length direction of the pre-step main-scale mark 22B and an enlargement amount B2 of the enlarged portion 27a in the width direction of the pre-step main-scale mark 22B can be set in accordance with deformation that is predicted when epitaxial growth is performed. For example, using the thickness T of a silicon layer formed by epitaxial growth, the enlargement amount B1 of the enlarged portion 27a is preferably set to approximately three times the thickness T (B1=3×t), and the enlargement amount B2 of the enlarged portion 27a is preferably set to be substantially equal to the thickness T (B2=T). An enlargement amount in the length direction and an enlargement amount in the width direction of the enlarged portion 27b are set in a manner similar to that of the enlargement amount B1 and the enlargement amount B2 of the enlarged portion 27a.

In the pre-step main-scale mark 22B formed in this manner, a pattern is lost in the directions of the broken-line arrows in "B" of FIG. 4. In other words, a pattern of a reentrant portion close to the mark detection region 25 is lost in the direction toward a side opposite to the mark detection region 25 (a direction other than toward the mark detection region 25). Thus, a loss amount associated with the epitaxial growth can be reduced in the pre-step main-scale mark 22B.

In other words, as indicated by the broken-line arrows in "B" of FIG. 4, the loss proceeds toward the open side of the reentrant portion with the vertex of the reentrant portion serving as a starting point, in association with the epitaxial growth. Hence, the arrangement in which the open side of the reentrant portion does not face the mark detection region 25 can prevent pattern loss associated with the epitaxial growth from influencing registration measurement.

Figure 5:
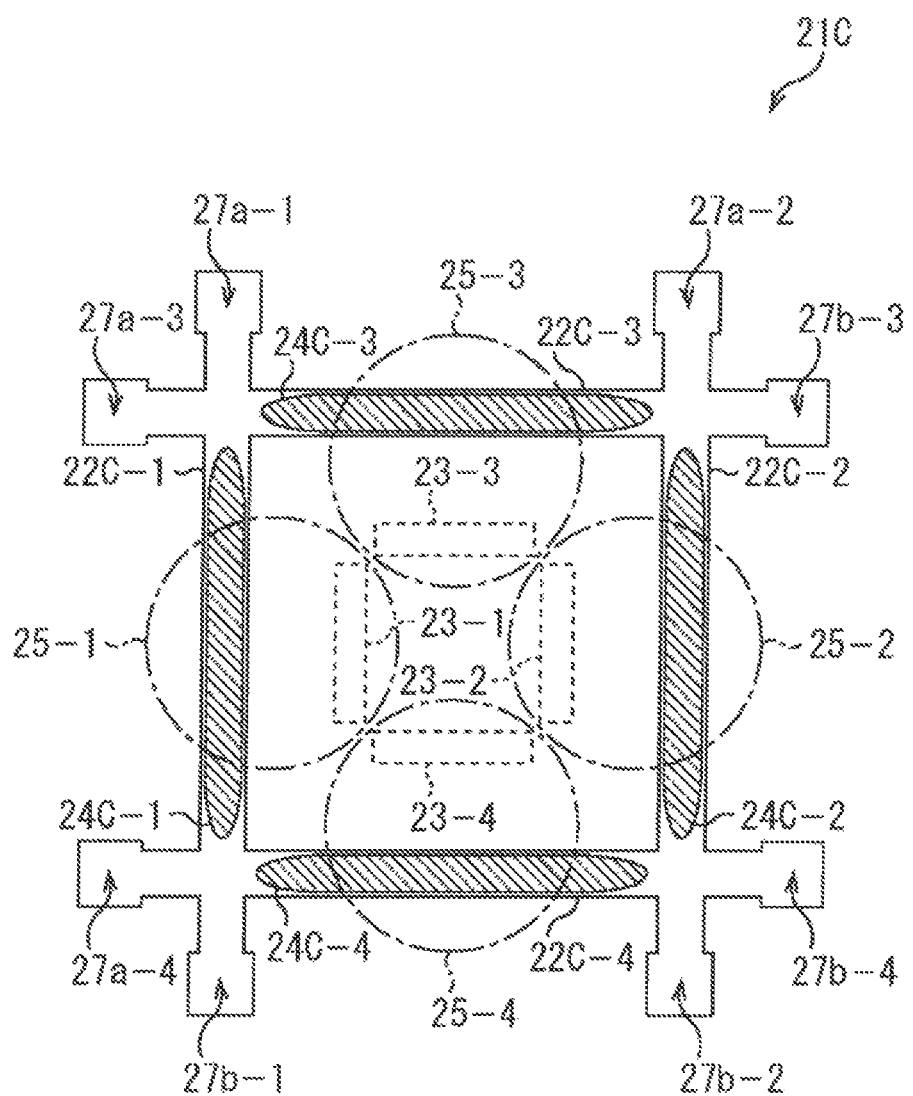
FIG. 5 illustrates an example configuration of a fourth embodiment of a registration measurement mark.

FIG. 5 illustrates an example configuration of a fourth embodiment of a registration measurement mark.

As illustrated in FIG. 5, in a registration measurement mark 21C, four pre-step main-scale marks 22C-1 to 22C-4 are arranged to intersect each other at both end portions, as in the registration measurement mark 21 of FIG. 2. In the registration measurement mark 21C, the enlarged portions 27a and 27b are provided at both ends of the pre-step main-scale marks 22C-1 to 22C-4, as in the pre-step main-scale marks 22B-1 to 22B-4 of FIG. 4.

In other words, the registration measurement mark 21C has a configuration in which the registration measurement mark 21 of FIG. 2 and the registration measurement mark 21B of FIG. 4 are combined.

Accordingly, the registration measurement mark 21C can obtain both of the effect produced by distancing the reentrant portions from the mark detection region 25, as in the registration measurement mark 21 of FIG. 2, and the effect of suppressing the influence of pattern loss from the reentrant portions serving as starting points, as in the registration measurement mark 21B of FIG. 4, and allows stronger suppression of pattern loss. Thus, using the registration measurement mark 21C allows measurement with higher precision and enhances registration precision.

Figure 6:
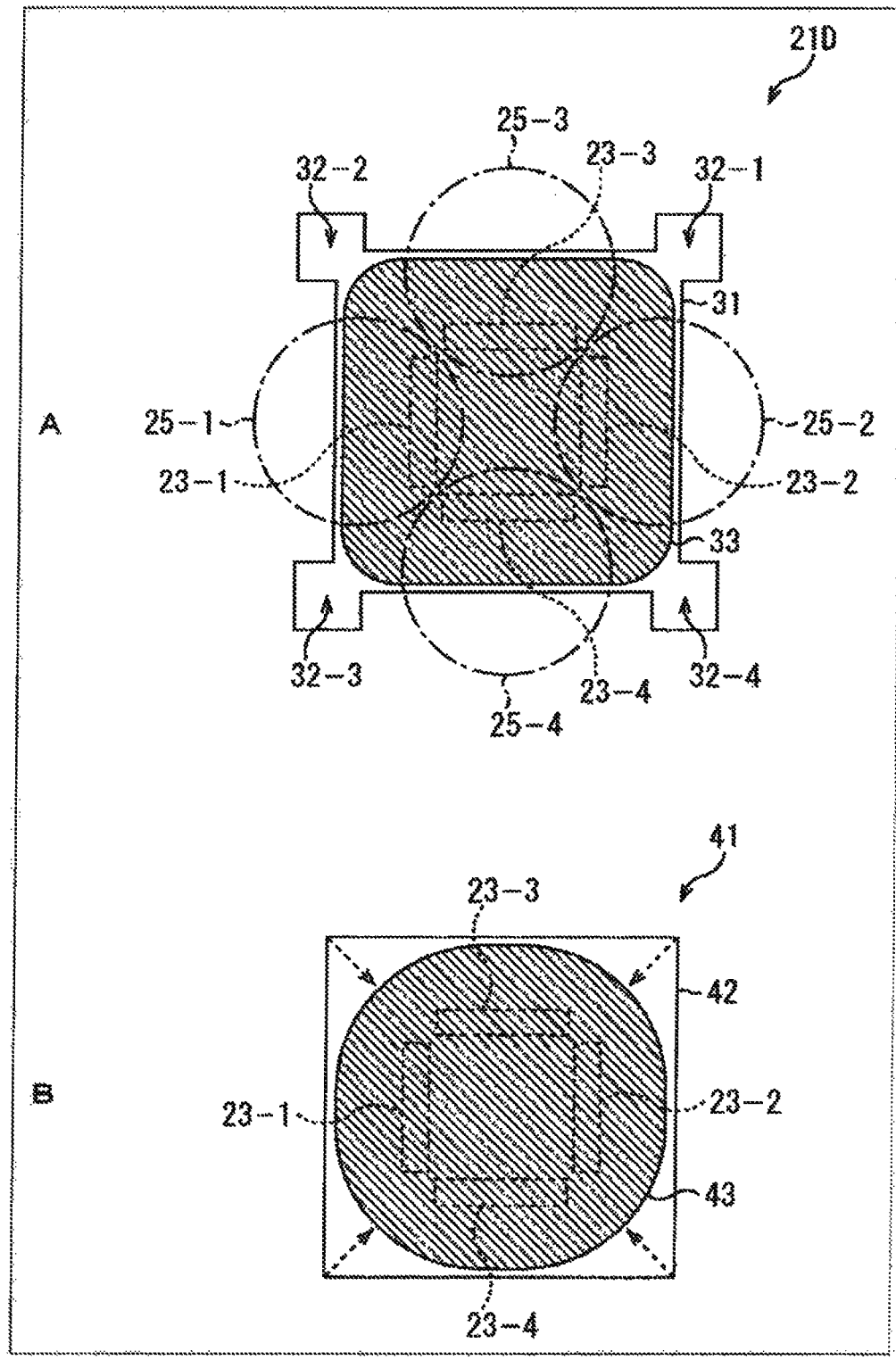
FIG. 6 illustrates an example configuration of a fifth embodiment of a registration measurement mark.

FIG. 6 illustrates an example configuration of a fifth embodiment of a registration measurement mark.

In FIG. 6, "A" illustrates a boxy-type registration measurement mark 21D, and "B" illustrates a conventional box-type registration measurement mark 41.

As illustrated in "A" of FIG. 6, in the registration measurement mark 21D, a pre-step main-scale mark 31 formed on a surface of a silicon substrate before a step of performing epitaxial growth includes four sides of a substantially square shape (box type) and expanded portions 32-1 to 32-4 provided at four corners.

For example, as illustrated in "B" of FIG. 6, the conventional box-type registration measurement mark 41 includes a pre-step main-scale mark 42 including four sides of a substantially square shape (box type). Therefore, a pattern is lost as indicated by the broken-line arrows from reentrant portions at four corners of the pre-step main-scale mark 42, and a post-step main-scale mark 43 is formed.

In contrast, in the registration measurement mark 21D, since the pre-step main-scale mark 31 includes the expanded portions 32-1 to 32-4, reentrant portions are distanced from the mark detection regions 25. Accordingly, in the registration measurement mark 21D, pattern loss from the reentrant portions can be reduced, which allows straight portions to remain in the mark detection regions 25 in a post-step main-scale mark 33. Thus, using the registration measurement mark 21D enhances measurement precision, as compared with in measuring a curved shape as in the conventional box-type registration measurement mark 41, and allows measurement with higher precision.

Figure 7:
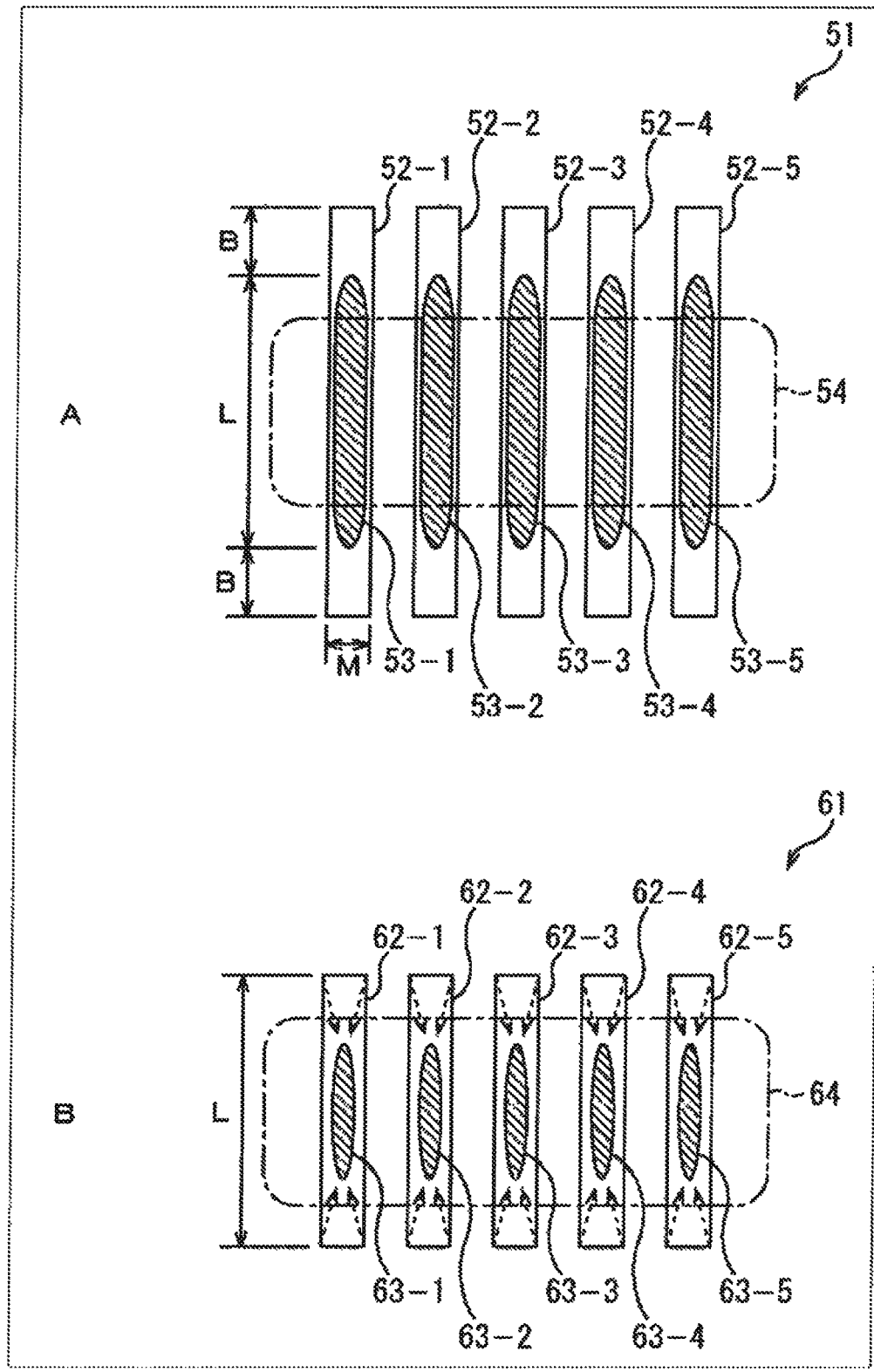
FIG. 7 illustrates an example configuration of a first embodiment of an alignment mark to which the present technology is applied.

Next, FIG. 7 illustrates an example configuration of a first embodiment of an alignment mark to which the present technology is applied.

In FIG. 7, "A" is a plan view of an alignment mark 51, and "B" illustrates a conventional alignment mark 61.

The alignment mark 51 has a configuration in which a plurality of measurement marks 52 having long and narrow shapes in a plan view (bar shapes) are arranged substantially parallel to each other with predetermined intervals therebetween, on a surface of a silicon substrate before a step of performing epitaxial growth. For example, the alignment mark 51 is used for measurement to detect, in performing patterning in a step after the step of performing epitaxial growth, positions of a step before the epitaxial growth on an exposure machine. In the example of FIG. 7, the alignment mark 51 includes five measurement marks 52-1 to 52-5.

Then, silicon is added by the epitaxial growth; thus, cross-sectional shapes of the measurement marks 52-1 to 52-5 are smoothly deformed and measurement marks 53-1 to 53-5 after the epitaxial growth are formed. Furthermore, in the following description, the measurement mark 52 before the step of performing epitaxial growth is called pre-step measurement mark 52, and the measurement mark 53 after the epitaxial growth is called post-step measurement mark 53, as appropriate.

In addition, the dashed-dotted line in FIG. 7 indicates a mark detection region 54 that is set in measuring intervals between the post-step measurement marks 53.

Here, as illustrated in "B" of FIG. 7, lengths L of pre-step measurement marks 62-1 to 62-5 are set to be slightly longer than a mark detection region 64 in the conventional alignment mark 61. Therefore, when the epitaxial growth is performed, the growth from reentrant portions is fast as indicated by the broken-line arrows; thus, both end portions are lost, and post-step measurement marks 63 having distorted shapes in which straight portions have been curved are formed.

In contrast, in the alignment mark 51, the pre-step measurement marks 52 have shapes with lengths longer than the length L of the alignment mark 61 by an extension amount B. Thus, the measurement marks 52-1 to 52-5 are formed such that reentrant end portions exhibiting fast epitaxial growth are distanced from the mark detection region 54 by a predetermined interval.

Accordingly, using the alignment mark 51 can prevent pattern loss from reaching the mark detection region 54, and prevent straight portions from being deformed to be curved in the mark detection range 54. This enhances detection precision in detecting alignment by measuring the intervals between the post-step measurement marks 53.

Furthermore, the number of the pre-step measurement marks 52 included in the alignment mark 51 is not limited to five as illustrated in FIG. 7, and may be changed as appropriate in accordance with an apparatus performing exposure.

Figure 8:
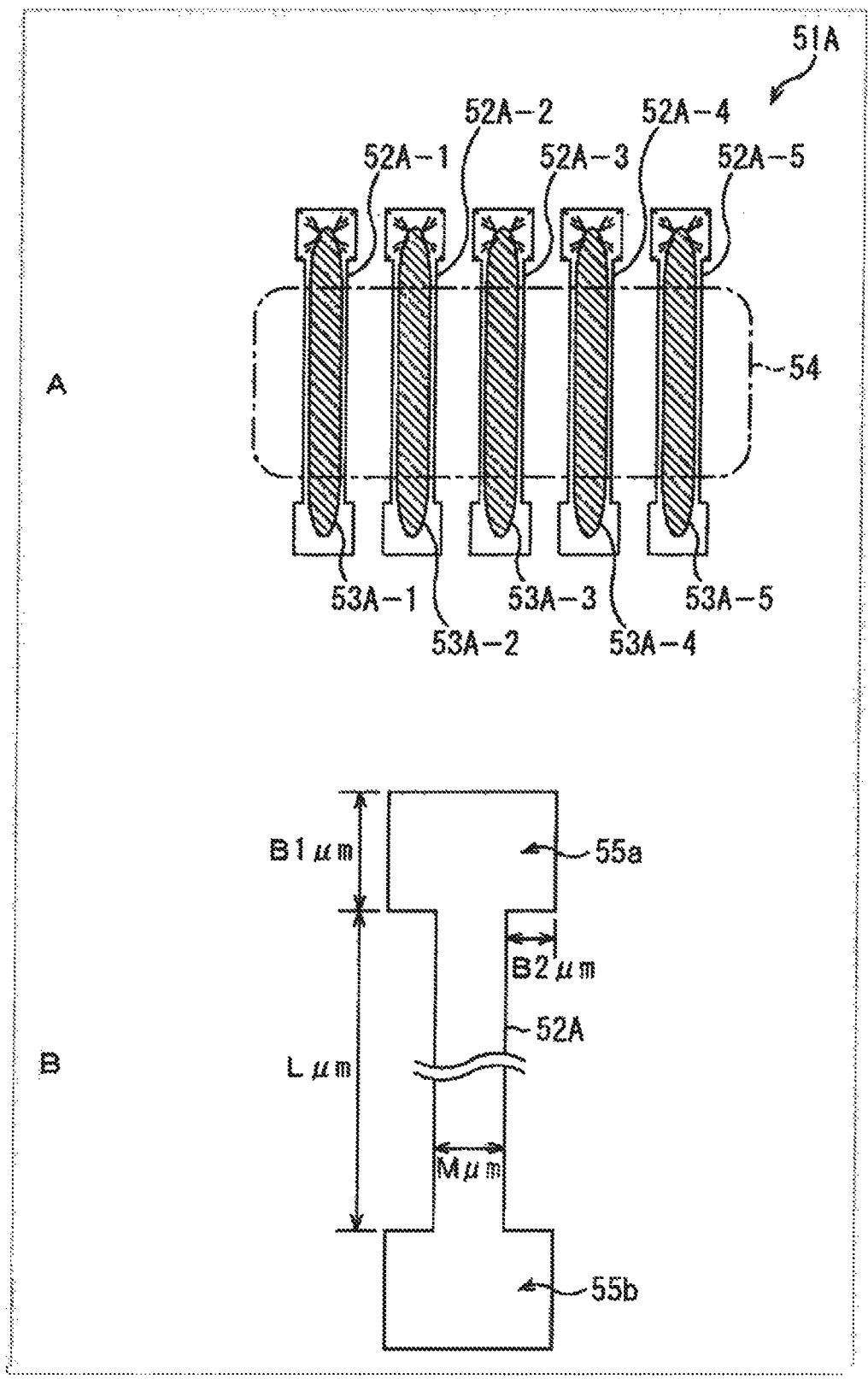
FIG. 8 illustrates an example configuration of a second embodiment of an alignment mark.

FIG. 8 illustrates an example configuration of a second embodiment of an alignment mark.

In FIG. 8, "A" is a plan view of an alignment mark 51A, and "B" is an enlarged view of the vicinities of both ends of a pre-step measurement mark 52A.

Like the alignment mark 51 of FIG. 7, the alignment mark 51A has a configuration in which five pre-step measurement marks 52A-1 to 52A-5 are arranged with predetermined intervals therebetween. Post-step measurement marks 53A-1 to 53A-5 are formed by performing epitaxial growth.

As illustrated in "B" of FIG. 8, enlarged portions 55a and 55b obtained by enlarging end portions of the pre-step measurement mark 52A in the length direction and the width direction are formed at both ends of the pre-step measurement mark 52A.

For example, an enlargement amount B1 of the enlarged portion 55a in the length direction of the pre-step measurement mark 52A and an enlargement amount B2 of the enlarged portion 55a in the width direction of the pre-step measurement mark 52A can be set in accordance with prediction of deformation of the pre-step measurement mark 52A due to the epitaxial growth. For example, the enlargement amount B1 of the enlarged portion 55a is preferably set to approximately three times a thickness T of a silicon layer formed by the epitaxial growth (B1=3×T), and the enlargement amount B2 of the enlarged portion 55a is preferably set to be substantially equal to the thickness T (B2=T). Furthermore, the enlarged portion 55b as well as the enlarged portion 55a is enlarged by the enlargement amount B1 and the enlargement amount B2.

In the pre-step measurement mark 52A formed in this manner, a pattern of a reentrant portion close to the mark detection region 54 is lost in the direction toward a side opposite to the mark detection region 54 (a direction other than toward the mark detection region 54). Thus, a loss amount associated with the epitaxial growth can be reduced in the pre-step measurement mark 52A. In other words, the arrangement in which the open side of the reentrant portion does not face the mark detection region 54 can prevent pattern loss associated with the epitaxial growth from influencing registration measurement.

Accordingly, using the alignment mark 51A can prevent pattern loss from reaching the mark detection region 54, and prevent straight portions from being deformed to be curved in the mark detection region 54, as compared with in the conventional alignment mark 61 ("B" of FIG. 7). This enhances detection precision is detecting alignment by measuring intervals between the post-step measurement marks 53A.

Figure 9:
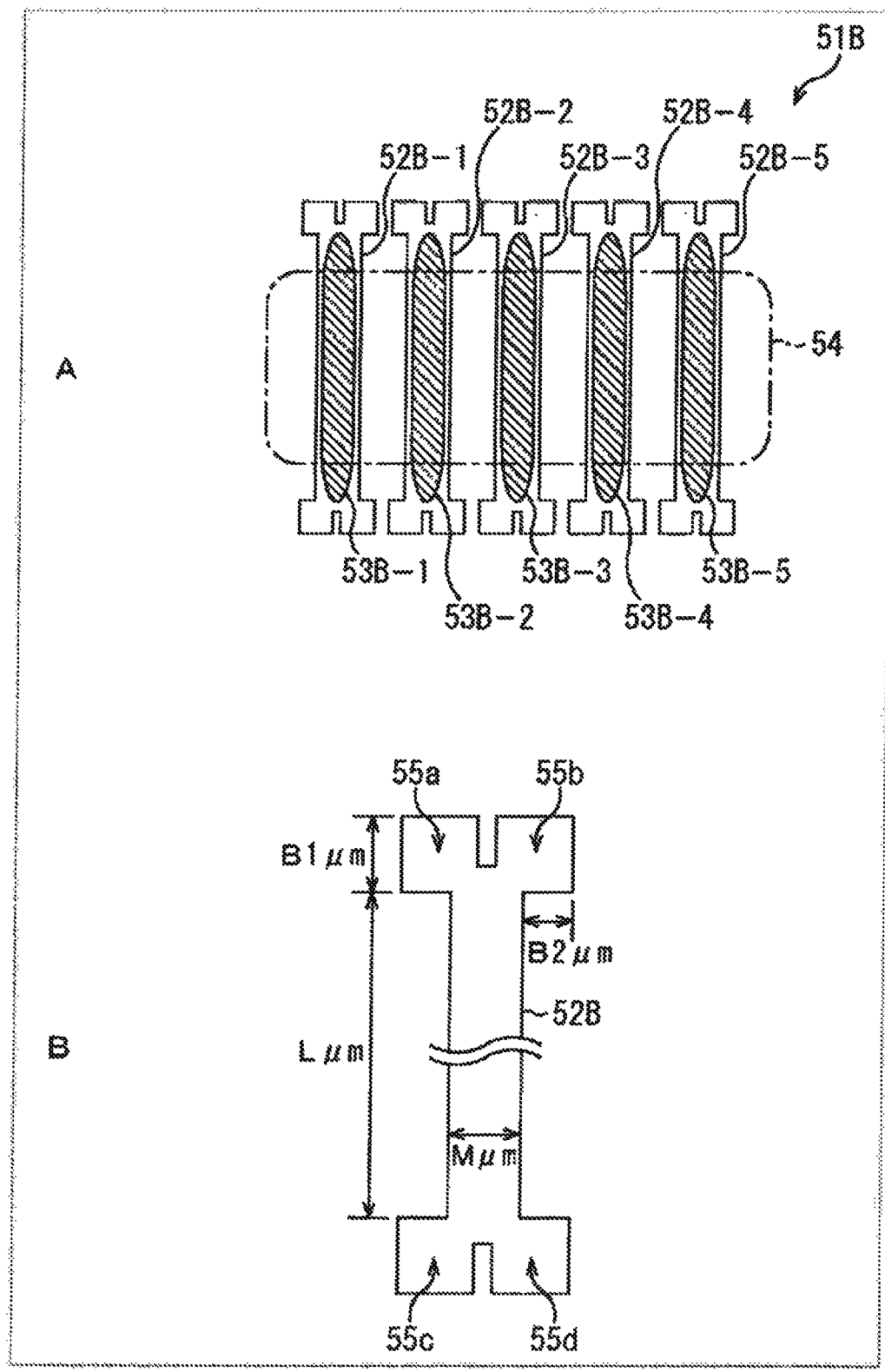
FIG. 9 illustrates an example configuration of a third embodiment of an alignment mark.

FIG. 9 illustrates an example configuration of a third embodiment of an alignment mark.

In FIG. 9, "A" is a plan view of an alignment mark 51B, and "B" is an enlarged view of the vicinities of both ends of a pre-step measurement mark 52B.

Like the alignment mark 51 of FIG. 7, the alignment mark 51B has a configuration in which five pre-step measurement marks 52B-1 to 52B-5 are arranged with predetermined intervals therebetween. Post-step measurement marks 53B-1 to 53B-5 are formed by performing epitaxial growth.

In the pre-step measurement mark 52B, as illustrated in "B" of FIG. 9, enlarged portions 55a to 55d are formed such that reentrant portions at four corners are enlarged toward the outside.

For example, an enlargement amount B1 of the enlarged portion 55a in the length direction of the pre-step measurement mark 52B and an enlargement amount B2 of the enlarged portion 55a in the width direction of the pre-step measurement mark 52B can be set in accordance with prediction of deformation of the pre-step measurement mark 52B due to the epitaxial growth. For example, the enlargement amount B1 of the enlarged portion 55a is preferably set to approximately three times a thickness T of a silicon layer formed by the epitaxial growth (B1=3×T), and the enlargement amount B2 of the enlarged portion 55a is preferably set to be substantially equal to the thickness T (B2=T). Furthermore, the enlarged portions 55b to 55d as well as the enlarged portion 55a are enlarged by the enlargement amount B1 and the enlargement amount B2.

Like the pre-step measurement mark 52A of FIG. 8, the pre-step measurement mark 52B formed in this manner can prevent pattern loss from reaching the mark detection region 54, and prevent straight portions from being deformed to be curved in the mark detection region 54. This enhances detection precision in detecting alignment by measuring intervals between the post-step measurement marks 53B.

As described above, by using the registration measurement mark 21 and the alignment mark 51 of each of the above embodiments, precise registration can be achieved before and after the step of performing epitaxial growth, even when epitaxial conditions that are advantageous in mass productivity and superior in characteristics and quality are used.

In addition, the registration measurement mark 21 and the alignment mark 51 of each of the above embodiments can be reduced in size and can prevent yield from being sacrificed. Consequently, for example, an epitaxial growth step can be introduced into a manufacturing process for a semiconductor device such as an image sensor, which is sensitive to silicon quality and requires strict registration precision. This enables a novel semiconductor device using a stacked structure inside silicon to be provided and allows mass productivity with high yield.

Figure 10:
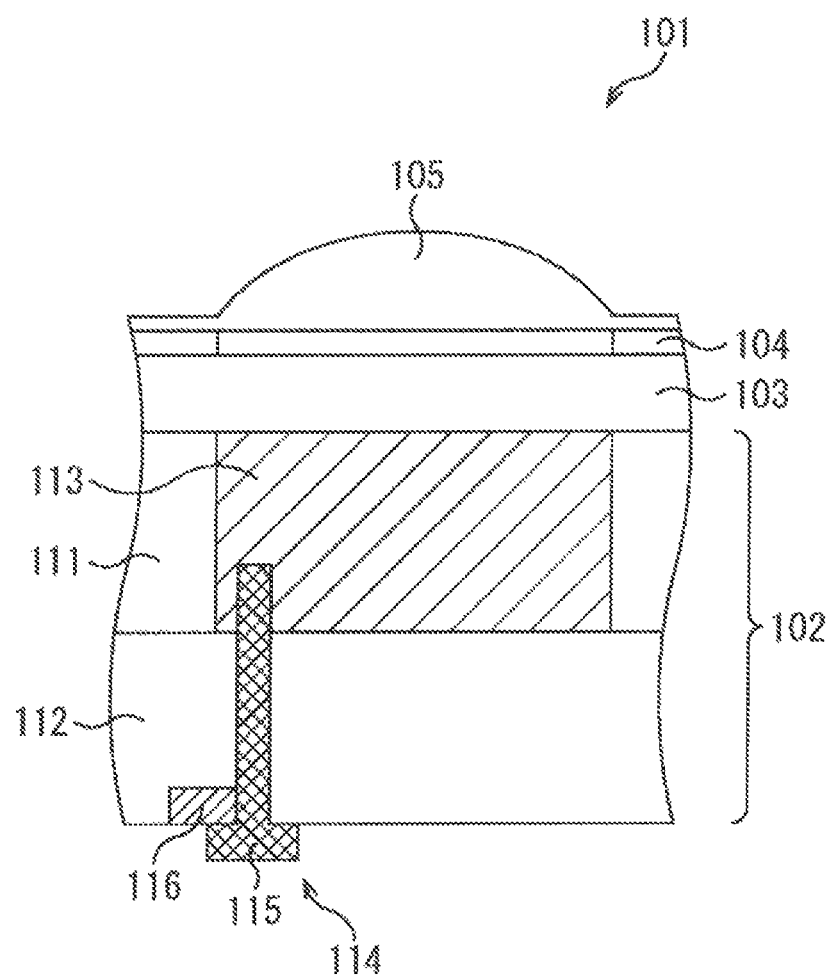
FIG. 10 is a schematic cross-sectional view of an example configuration of a solid-state image sensor.

FIG. 10 is a schematic cross-sectional view of an example configuration of a solid-state image sensor.

As illustrated in FIG. 10, a solid-state image sensor 101 includes a semiconductor substrate 102, an insulating film 103, a color filter layer 104, and an on-chip lens layer 105, which are stacked. Furthermore, in FIG. 10, a surface facing downward is called a front surface, and a surface facing upward is called a rear surface.

The semiconductor substrate 102 includes a silicon wafer 111 having an epitaxial layer 112 stacked on its front surface side. For example, after a photodiode 113 is formed in the silicon wafer 111, the epitaxial layer 112 is formed by performing epitaxial growth on a front surface of the silicon wafer 111. Then, various pixel transistors, such as a transfer transistor 114, are formed on a front surface of the epitaxial layer 112.

In other words, the solid-state image sensor 101 has a stacked structure in which the photodiode 113 formed in the silicon wafer 111 and the transfer transistor 114 formed on the epitaxial layer 112 are stacked.

The transfer transistor 114 includes a vertical gate electrode 115 extending in the vertical direction and a floating diffusion (FD) portion 116, which is a floating diffusion region. The vertical gate electrode 115 is formed by forming a through hole from the front surface of the epitaxial layer 112 to the photodiode 113 of the silicon wafer 111, and filling the through hole with a material having conductivity.

When, in the solid-state image sensor 101 with a stacked structure, the vertical gate electrode 115 is formed to be connected to the photodiode 113 of the silicon wafer 111 in this manner, registration measurement is performed by using, for example, the registration measurement mark 21 illustrated in FIG. 2. Thus, the vertical gate electrode 115 can be surely connected to the photodiode 113.

As described above, by manufacturing the solid-state image sensor 101 by using the registration measurement mark 21, registration between the photodiode 113 and the transfer transistor 114 to be stacked can be performed with higher precision.

Furthermore, the present technology can be applied to various semiconductor devices with a stacked structure, in addition to the solid-state image sensor 101.

In addition, the above-described solid-state image sensor 101 can be applied to, for example, various electronic apparatuses, such as imaging systems (e.g., digital still cameras and digital video cameras), mobile phones with an imaging function, and other apparatuses with an imaging function.

Figure 11:
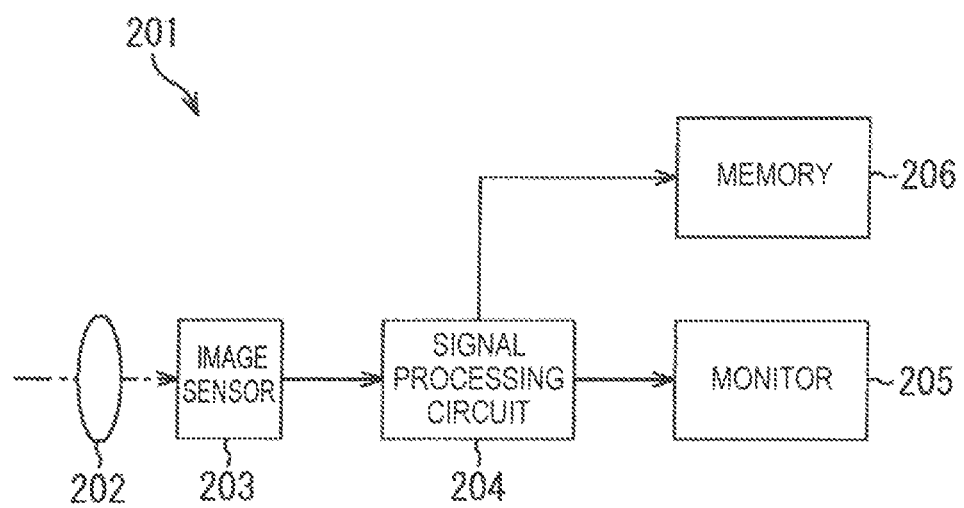
FIG. 11 is a block diagram illustrating an example configuration of an imaging apparatus to be mounted on an electronic apparatus.

FIG. 11 is a block diagram illustrating an example configuration of an imaging apparatus to be mounted on an electronic apparatus.

As illustrated in FIG. 11, an imaging apparatus 201 includes an optical system 202, an image sensor 203, a signal processing circuit 204, a monitor 205, and a memory 206, and can capture still images and moving images.

The optical system 202 includes one or a plurality of lenses, and guides image light (incident light) from an object to the image sensor 203 to form an image on a light-receiving surface (sensor portion) of the image sensor 203.

The above-described solid-state image sensor 101 is used as the image sensor 203. Electrons are accumulated in the image sensor 203 for a certain period, in accordance with the image formed on the light-receiving surface through the optical system 202. Then, signals corresponding to the electrons accumulated in the image sensor 203 are supplied to the signal processing circuit 204.

The signal processing circuit 204 performs various kinds of signal processing on pixel signals output from the image sensor 203. An image (image data) obtained by the signal processing circuit 204 performing signal processing is supplied to the monitor 205 to be displayed, or supplied to the memory 206 to be stored (recorded).

In the imaging apparatus 201 with such a configuration, images can be obtained in high-definition quality with little defect, for example, by using the above-described solid-state image sensor 101.

Additionally, the present technology may also be configured as below.

(1)

A semiconductor device including:

a semiconductor layer where a predetermined first element is formed; and a growth layer where a second element to be stacked on the first element of the semiconductor layer is formed, the growth layer being formed by growing a crystalline layer with aligned crystal axes on the semiconductor layer, wherein a reentrant portion formed at an end portion of a measurement mark used for measurement to perform relative adjustment before and after a step of forming the growth layer is formed to be distanced from a detection region for detecting the measurement mark by a predetermined distance.

(2)

The semiconductor device according to (1), wherein the predetermined distance by which the reentrant portion formed at the end portion of the measurement mark is distanced from the detection region is set in accordance with prediction of deformation of the measurement mark associated with growth of the growth layer.

(3)

The semiconductor device according to (1) or (2), wherein the measurement mark is formed so that an open side of part of a plurality of the reentrant portions faces a side opposite to the detection region.

(4)

The semiconductor device according to any of (1) to (3), wherein the measurement mark includes four bar-shaped marks arranged so that pairs of the marks facing each other are substantially orthogonal to each other, each mark being arranged to intersect another mark substantially orthogonal to the mark around vicinities of both end portions.

(5)

The semiconductor device according to any of (1) to (4), wherein corner portions are formed by expanding intersections of the marks to an outside of the measurement mark.

(6)

The semiconductor device according to any of (1) to (5), wherein the measurement mark includes four bar-shaped marks arranged so that pairs of the marks facing each other are substantially orthogonal to each other, and an enlarged portion is formed by enlarging an end portion of the mark in a length direction and a width direction at both ends of each mark.

(7)

The semiconductor device according to any of (1) to (6), wherein each mark is arranged to intersect another mark substantially orthogonal to the mark around vicinities of both end portions.

(8)

The semiconductor device according to (1), wherein the measurement mark includes four sides of a substantially square shape and expanded portions provided so that four corners are expanded to an outside.

(9)

The semiconductor device according to (1), wherein the measurement mark includes a plurality of bar-shaped marks arranged substantially parallel to each other with predetermined intervals between the marks.

(10)

The semiconductor device according to (9), wherein in the measurement mark, an enlarged portion is formed by enlarging an end portion of the mark in a length direction and a width direction at both ends of each mark.

(11)

A method of manufacturing a semiconductor device, including:

forming a semiconductor layer where a predetermined first element is formed; and forming a growth layer where a second element to be stacked on the first element of the semiconductor layer is formed, the growth layer being formed by growing a crystalline layer with aligned crystal axes on the semiconductor layer, wherein a reentrant portion formed at an end portion of a measurement mark used for measurement to perform relative adjustment before and after a step of forming the growth layer is formed to be distanced from a detection region for detecting the measurement mark by a predetermined distance.

(12)

An electronic apparatus including a semiconductor device, wherein the semiconductor device includes:

a semiconductor layer where a predetermined first element is formed; and a growth layer where a second element to be stacked on the first element of the semiconductor layer is formed, the growth layer being formed by growing a crystalline layer with aligned crystal axes on the semiconductor layer, wherein a reentrant portion formed at an end portion of a measurement mark used for measurement to perform relative adjustment before and after a step of forming the growth layer is formed to be distanced from a detection region for detecting the measurement mark by a predetermined distance.

The present embodiments are not limited to the above-described embodiments, and various modifications are possible without departing from the scope of the present disclosure.

REFERENCE SYMBOLS LIST 21 registration measurement mark
22 pre-step main-scale mark
23 sub-scale mark
24 post-step main-scale mark
25 mark detection region
26 corner portion
27 enlarged portion
31 pre-step main-scale mark
32 expanded portion
33 post-step main-scale mark
41 registration measurement mark
42 pre-step main-scale mark
43 post-step main-scale mark
51 alignment mark
52 pre-step measurement mark
53 post-step measurement mark
54 mark detection region
55 enlarged portion

The invention claimed is:

1. A semiconductor device, including:

a semiconductor layer in which a first element is present;

a growth layer on which a second element, to be stacked on the first element of the semiconductor layer, is present, wherein the growth layer is composed of a crystalline layer with aligned crystal axes on the semiconductor layer;

a reentrant portion present at an end portion of a measurement mark, wherein the measurement mark is utilized to execute relative adjustment before and after a formation of the growth layer; and a detection region to detect the measurement mark, wherein the measurement mark and the detection region are present on the semiconductor layer, and wherein the measurement mark and the detection region are separated by a particular distance.

2. The semiconductor device according to claim 1,
wherein the measurement mark includes four bar-shaped marks arranged so that a first pair of the bar-shaped marks faces orthogonally a second pair of the bar-shaped marks, and each of the bar-shaped marks orthogonally intersects another of the bar-shaped marks.

3. The semiconductor device according to claim 1,
wherein the measurement mark includes a plurality of bar-shaped marks arranged parallel to each of the plurality of bar-shaped marks with a regular interval between each of the plurality of bar-shaped marks.

4. A method of manufacturing a semiconductor device, including:
 forming a first element in a semiconductor layer;
 forming a growth layer by growing a crystalline layer with aligned crystal axes on the semiconductor layer; and
 forming a second element, to be stacked on the first element of the semiconductor layer, on the growth layer,
 wherein a reentrant portion formed at an end portion of a measurement mark,
 wherein the measurement mark is utilized to execute relative adjustment before and after the forming of the growth layer, and
 wherein the measurement mark and a detection region for detecting the measurement mark are separated by a particular distance.

5. An electronic apparatus including a semiconductor device, wherein the semiconductor device comprises:
 a semiconductor layer in which a first element is present;
 a growth layer on which a second element, to be stacked on the first element of the semiconductor layer, is present,
 wherein the growth layer is composed of a crystalline layer with aligned crystal axes on the semiconductor layer;
 a reentrant portion present at an end portion of a measurement mark,
 wherein the measurement mark is utilized to execute relative adjustment before and after a formation of the growth layer; and
 a detection region to detect the measurement mark,
 wherein the measurement mark and the detection region are present on the semiconductor layer, and
 wherein the measurement mark and the detection region are separated by a particular distance.

* * * * *